United States Patent
Funk et al.

(10) Patent No.: US 9,163,779 B2
(45) Date of Patent: Oct. 20, 2015

(54) TABLET MOUNTING SYSTEMS, STANDS, AND METHODS

(71) Applicant: Ergotron, Inc., Saint Paul, MN (US)

(72) Inventors: Joe Funk, Rosemount, MN (US); Shaun C. Lindblad, Lino Lakes, MN (US)

(73) Assignee: Ergotron, Inc., St. Paul, MN (US)

( * ) Notice: Subject to any disclaimer, the term of this patent is extended or adjusted under 35 U.S.C. 154(b) by 158 days.

(21) Appl. No.: 13/651,066

(22) Filed: Oct. 12, 2012

(65) Prior Publication Data

US 2013/0092811 A1    Apr. 18, 2013

Related U.S. Application Data (60) Provisional application No. 61/547,257, filed on Oct. 14, 2011, provisional application No. 61/553,620, filed on Oct. 31, 2011, provisional application No. 61/583,847, filed on Jan. 6, 2012, provisional application No. 61/590,032, filed on Jan. 24, 2012.

(51) Int. Cl.
*F16M 11/00*   (2006.01)
*F16M 13/02*   (2006.01)
(Continued)

(52) U.S. Cl.
CPC ............ *F16M 13/02* (2013.01); *F16M 13/00* (2013.01); *F16M 13/022* (2013.01); *G06F 1/1607* (2013.01); *G06F 1/1626* (2013.01); *G06F 1/1632* (2013.01); *H05K 5/0204* (2013.01);
(Continued)

(58) Field of Classification Search
CPC ...... F16M 11/10; F16M 11/38; F16M 1/1632
USPC ................ 248/309.1, 346.01, 346.03, 176.1; 361/679.01, 679.03
See application file for complete search history.

(56) References Cited

U.S. PATENT DOCUMENTS

| 4,683,424 A | 7/1987 | Cutright et al. |
| 4,720,048 A | 1/1988 | Maroney et al. |

(Continued)

FOREIGN PATENT DOCUMENTS

| EP | 0997399 A2 | 5/2000 |
| EP | 2045689 | 4/2009 |

(Continued)

OTHER PUBLICATIONS

"U.S. Appl. No. 13/025,782, Non Final Office Action mailed Oct. 9, 2012", 11 pgs.

(Continued)

*Primary Examiner* — Amy Sterling
(74) *Attorney, Agent, or Firm* — Schwegman Lundberg & Woessner, P.A.

(57) ABSTRACT

Embodiments of a tablet mounting system include a detachable tablet stand and a tablet mount. The tablet stand is configured to releasably retain a tablet and to rest on a horizontal surface such that a plane defined by the tablet stand forms an angle with the horizontal surface. The formed angle is equal to or greater than zero, and less than or equal to ninety degrees. The tablet mount is configured to attach to a support member. The tablet mount is configured to releasably retain the tablet stand and the tablet retained within the tablet stand. The tablet stand can be configured to releasably retain a tablet by compression against a length of the tablet or by compression against a thickness of the tablet. The tablet mount can include a docking station that has a connector configured to connect with a port on a tablet.

11 Claims, 9 Drawing Sheets

(51) Int. Cl.
*F16M 13/00* (2006.01)
*H05K 5/02* (2006.01)
*G06F 1/16* (2006.01)

(52) U.S. Cl.
CPC ...... *Y10T29/49817* (2015.01); *Y10T 29/49826* (2015.01); *Y10T 29/49948* (2015.01)

(56) References Cited

U.S. PATENT DOCUMENTS

| | | | |
|---|---|---|---|
| 4,922,721 | A | 5/1990 | Robertson et al. |
| 5,301,346 | A | 4/1994 | Notarianni et al. |
| 5,436,792 | A * | 7/1995 | Leman et al. ............ 361/679.44 |
| 5,457,745 | A | 10/1995 | Wang |
| 5,513,066 | A | 4/1996 | Berman |
| 5,528,453 | A | 6/1996 | Berman et al. |
| 5,621,890 | A | 4/1997 | Notarianni et al. |
| 5,899,421 | A * | 5/1999 | Silverman .................... 248/175 |
| 6,008,621 | A | 12/1999 | Madison et al. |
| 6,189,849 | B1 | 2/2001 | Sweere |
| 6,218,796 | B1 | 4/2001 | Kozlowski |
| D450,903 | S | 11/2001 | Wacker et al. |
| 6,336,691 | B1 | 1/2002 | Maroney et al. |
| 6,434,512 | B1 | 8/2002 | Discenzo |
| 6,480,391 | B1 | 11/2002 | Monson et al. |
| 6,667,877 | B2 | 12/2003 | Duquette |
| 6,783,105 | B2 | 8/2004 | Oddsen, Jr. |
| 6,796,844 | B1 | 9/2004 | Edwards, III |
| 6,967,632 | B1 | 11/2005 | Minami et al. |
| 7,055,833 | B2 | 6/2006 | Wixted et al. |
| 7,130,190 | B1 | 10/2006 | Baker |
| 7,160,113 | B2 | 1/2007 | McConnell |
| 7,238,042 | B2 * | 7/2007 | Chen et al. .................... 439/374 |
| 7,252,277 | B2 | 8/2007 | Sweere |
| 7,274,564 | B2 | 9/2007 | Rossini |
| 7,325,891 | B1 | 2/2008 | Kinsley et al. |
| 7,537,190 | B2 | 5/2009 | Fan |
| 7,551,458 | B2 | 6/2009 | Carnevali |
| 7,595,995 | B2 | 9/2009 | Hock |
| 7,643,291 | B2 | 1/2010 | Mallia et al. |
| 7,679,902 | B2 * | 3/2010 | Thompson ............... 361/679.44 |
| 7,800,914 | B2 | 9/2010 | Dully |
| 7,845,608 | B1 | 12/2010 | Chen et al. |
| 7,887,014 | B2 | 2/2011 | Lindblad |
| 7,984,886 | B2 | 7/2011 | Lin |
| 8,047,383 | B2 | 11/2011 | Hendrix et al. |
| 8,066,242 | B2 | 11/2011 | Potter et al. |
| 8,074,951 | B2 | 12/2011 | Carnevali |
| 8,240,628 | B2 | 8/2012 | Huang |
| 8,243,455 | B1 | 8/2012 | Raymond et al. |
| 8,320,110 | B2 | 11/2012 | Chen |
| 8,422,206 | B2 * | 4/2013 | Fu et al. .................... 361/679.01 |
| 8,469,325 | B2 | 6/2013 | Yu |
| 8,503,182 | B2 | 8/2013 | Petrick et al. |
| 8,752,848 | B2 | 6/2014 | Petrick et al. |
| 8,811,007 | B2 * | 8/2014 | Zhou .................... 361/679.41 |
| 8,833,716 | B2 | 9/2014 | Funk et al. |
| 9,030,828 | B2 | 5/2015 | Lindblad et al. |
| 2003/0021091 | A1 | 1/2003 | Robbins et al. |
| 2003/0111245 | A1 | 6/2003 | Haggerty |
| 2003/0141687 | A1 | 7/2003 | Wixted et al. |
| 2003/0222848 | A1 * | 12/2003 | Solomon et al. .............. 345/156 |
| 2003/0227753 | A1 | 12/2003 | Wrycraft |
| 2003/0235029 | A1 | 12/2003 | Doherty et al. |
| 2004/0058704 | A1 * | 3/2004 | Peiker ........................ 455/550.1 |
| 2004/0139571 | A1 | 7/2004 | Chang et al. |
| 2004/0240167 | A1 | 12/2004 | Ledbetter |
| 2004/0257753 | A1 | 12/2004 | Rossini |
| 2005/0030706 | A1 | 2/2005 | Kim |
| 2005/0110461 | A1 | 5/2005 | Mcconnell et al. |
| 2006/0274495 | A1 * | 12/2006 | Nakamura et al. ............ 361/686 |
| 2007/0002533 | A1 | 1/2007 | Kogan et al. |
| 2007/0049071 | A1 | 3/2007 | Jackson et al. |
| 2007/0058344 | A1 | 3/2007 | Baker |
| 2007/0084978 | A1 | 4/2007 | Martin |
| 2007/0168593 | A1 | 7/2007 | Montag et al. |
| 2007/0259554 | A1 | 11/2007 | Lindblad |
| 2008/0106870 | A1 | 5/2008 | Dully |
| 2008/0117578 | A1 | 5/2008 | Moscovitch |
| 2008/0225472 | A1 | 9/2008 | Chih |
| 2009/0016008 | A1 | 1/2009 | Hock |
| 2009/0096336 | A1 | 4/2009 | Petrick et al. |
| 2009/0122474 | A1 | 5/2009 | Mickey et al. |
| 2009/0134285 | A1 | 5/2009 | Huang et al. |
| 2009/0146911 | A1 | 6/2009 | Kang |
| 2009/0240370 | A1 | 9/2009 | Nichols et al. |
| 2009/0267772 | A1 | 10/2009 | Dehnadi |
| 2009/0270727 | A1 * | 10/2009 | Zhao et al. .................... 600/437 |
| 2010/0176254 | A1 | 7/2010 | Sweere |
| 2011/0193524 | A1 | 8/2011 | Hazzard et al. |
| 2011/0240830 | A1 | 10/2011 | Alemozafar et al. |
| 2011/0264927 | A1 | 10/2011 | Dearborn et al. |
| 2011/0266930 | A1 | 11/2011 | Petrick et al. |
| 2011/0267782 | A1 | 11/2011 | Petrick et al. |
| 2011/0309591 | A1 | 12/2011 | Petrick et al. |
| 2012/0087074 | A1 | 4/2012 | Chen |
| 2012/0119040 | A1 | 5/2012 | Ergun et al. |
| 2012/0173033 | A1 | 7/2012 | Tischer |
| 2012/0187056 | A1 | 7/2012 | Hazzard |
| 2012/0206867 | A1 | 8/2012 | Pence |
| 2012/0223676 | A1 | 9/2012 | Petrick et al. |
| 2013/0050932 | A1 * | 2/2013 | Williams ................. 361/679.41 |
| 2013/0092805 | A1 | 4/2013 | Funk |
| 2013/0200584 | A1 | 8/2013 | Guasta |
| 2013/0262248 | A1 * | 10/2013 | Kim et al. ........................ 705/17 |
| 2013/0277520 | A1 | 10/2013 | Funk et al. |
| 2013/0277930 | A1 | 10/2013 | Ergun et al. |
| 2013/0279106 | A1 | 10/2013 | Ergun et al. |
| 2013/0279109 | A1 | 10/2013 | Lindblad et al. |

FOREIGN PATENT DOCUMENTS

| | | |
|---|---|---|
| EP | 2766784 A1 | 8/2014 |
| WO | WO-0177799 A1 | 10/2001 |
| WO | WO-2011017757 A1 | 2/2011 |
| WO | WO-2013056025 A1 | 4/2013 |
| WO | WO-2013056029 | 4/2013 |

OTHER PUBLICATIONS

"U.S. Appl. No. 13/650,572, Non Final Office Action mailed May 12, 2014", 10 pgs.

"U.S. Appl. No. 13/650,616, Non Final Office Action mailed Jan. 28, 2014", 15 pgs.

"U.S. Appl. No. 13/650,616, Restriction Requirement mailed Apr. 29, 2014", 6 pgs.

"U.S. Appl. No. 13/650,631, Non Final Office Action mailed Oct. 9, 2013", 11 pgs.

"U.S. Appl. No. 13/650,631, Notice of Allowance mailed May 21, 2014", 8 pgs.

"U.S. Appl. No. 13/650,631, Response filed Feb. 7, 2014 to Non Final Office Action mailed Oct. 9, 2013", 11 pgs.

"U.S. Appl. No. 13/650,631, Response filed Sep. 26, 2013 to Restriction Requirement mailed Aug. 29, 2013", 2 pgs.

"U.S. Appl. No. 13/650,631, Restriction Requirement mailed Aug. 29, 2013", 6 pgs.

"U.S. Appl. No. 13/650,702, Response filed Apr. 10, 2014 to Restriction Requirement mailed Feb. 12, 2014", 12 pgs.

"U.S. Appl. No. 13/650,702, Restriction Requirement mailed Feb. 2, 2014", 10 pgs.

"International Application Serial No. PCT/US2011/024534, International Search Report mailed Apr. 15, 2011", 2 pgs.

"International Application Serial No. PCT/US2011/024534, Written Opinion mailed Apr. 15, 2011", 8 pgs.

"International Application Serial No. PCT/US2012/059922, International Preliminary Report on Patentability mailed Apr. 24, 2014", 6 pgs.

"International Application Serial No. PCT/US2012/059922, International Search Report mailed Feb. 4, 2013", 3 pgs.

"International Application Serial No. PCT/US2012/059922, Written Opinion mailed Feb. 4, 2013", 5 pgs.

(56) References Cited

OTHER PUBLICATIONS

"International Application Serial No. PCT/US2012/059926, International Preliminary Report on Patentability mailed Apr. 24, 2014", 7 pgs.

"International Application Serial No. PCT/US2012/059926, International Search Report mailed Feb. 8, 2013", 3 pgs.

"International Application Serial No. PCT/US2012/059926, Written Opinion mailed Feb. 8, 2013", 6 gs.

"International Application Serial No. PCT/US2012/060042, International Search Report mailed Jan. 30, 2013", 4 pgs.

"International Application Serial No. PCT/US2012/060042, Written Opinion mailed Jan. 30, 2013", 6 pgs.

"International Application Serial No. PCT/US2012/060049, International Search Report mailed Feb. 19, 2013", 4 pgs.

"International Application Serial No. PCT/US2012/060049, Written Opinion mailed Feb. 19, 2013", 7 pgs.

"International Application Serial No. PCT/US2012/060053, International Preliminary Report on Patentability mailed Apr. 24, 2014", 7 pgs.

"International Application Serial No. PCT/US2012/060056, International Preliminary Report on Patentability mailed Apr. 24, 2014", 7 pgs.

International Search Report and Written Opinion, dated Feb. 22, 2013 for PCT Application No. PCT/US2012/060056, 8 pages.

International Search Report and Written Opinion, dated Feb. 25, 2013 for PCT Application No. PCT/US2012/060053, 9 pages.

Ergotron® WorkFit C-Mod, Combo, Product Sheet, Aug. 10, 2009, 1 page.

"U.S. Appl. No. 13/650,572, Notice of Allowance mailed Sep. 16, 2014", 8 pgs.

"U.S. Appl. No. 13/650,572, Response filed Aug. 12, 2014 to Non Final Office Action mailed May 12, 2014", 10 pgs.

"U.S. Appl. No. 13/650,616, Non Final Office Action mailed Oct. 1, 2014", 8 pgs.

"U.S. Appl. No. 13/650,616, Response filed Jun. 24, 2014 to Restriction Requirement mailed Apr. 29, 2014", 5 pgs.

"U.S. Appl. No. 13/650,702, Non Final Office Action mailed Sep. 29, 2014", 14 pgs.

"U.S. Appl. No. 13/650,702, Response filed Jul. 28, 2014 to Restriction Requirement mailed Jun. 26, 2014", 12 pgs.

"U.S. Appl. No. 13/650,702, Restriction Requirement mailed Jun. 26, 2014", 10 pgs.

"U.S. Appl. No. 13/650,572, Notice of Allowance mailed Jan. 16, 2015", 8 pgs.

"U.S. Appl. No. 13/650,616, Response filed Dec. 19, 2014 to Non Final Office Action mailed Oct. 1, 2014", 9 pgs.

"U.S. Appl. No. 13/650,702, Response filed Dec. 17, 2014 Non Final Office Action mailed Sep. 29, 2014", 12 pgs.

"U.S. Appl. No. 13/650,736, Non Final Office Action mailed Nov. 28, 2014", 20 pgs.

"U.S. Appl. No. 13/650,616,Response filed Apr. 20, 2015 to Final Office Action mailed Feb. 20, 2015", 8 pgs.

"U.S. Appl. No. 13/650,702, Final Office Action mailed Mar. 26, 2015", 17 pgs.

"U.S. Appl. No. 13/650,736, Final Office Action mailed Apr. 9, 2015", 13 pgs.

"U.S. Appl. No. 13/650,616, Advisory Action mailed May 27, 2015", 3 pgs.

"U.S. Appl. No. 13/650,702, Response filed May 15, 2015 to Final Office Action mailed Mar. 26, 2015", 15 pgs.

"U.S. Appl. No. 13/650,736, Examiner Interview Summary mailed May 26, 2015", 3 pgs.

"U.S. Appl. No. 13/650,736, Response filed May 22, 2015 to Final Office Action mailed Apr. 9, 2015", 13 pgs.

* cited by examiner

TABLET MOUNTING SYSTEMS, STANDS, AND METHODS

RELATED APPLICATIONS

This application claims the benefit of U.S. Provisional Application Ser. Nos. 61/547,257, 61/553,620, 61/583,847, and 61/590,032, all four of which are entitled Tablet Mounting Systems and Methods, filed Oct. 14, 2011, Oct. 31, 2011, Jan. 6, 2012 and Jan. 24, 2012, respectively, the contents of each of which are hereby incorporated by reference.

FIELD

This disclosure generally relates to systems, devices and methods for supporting a mobile computing device, such as a tablet computing device.

BACKGROUND

Tablet computing devices, sometimes referred to as tablets, or as tablet computers, are generally planar, lightweight devices that include a touch-screen display. Examples include the Apple iPad, Kindle Fire, Motorola Xoom, Samsung Galaxy, Blackberry Playbook, LG Optimus Pad, Dell Streak, HP TouchPad, HTC Flyer, and Viewsonic ViewPad. Generally, tablets have a rectangular form factor that may be considered smaller than a traditional laptop or desktop computer monitor but larger than a smaller electronic device such as a smartphone. For example, in some cases tablets may be about 20 CM to about 30 CM in length, about 10 CM to about 20 CM in height, and about 1 CM in thickness or less, with a weight of between about 400 grams and about 1 KG. Tablets also generally have a display panel (e.g. LCD or TFT) with a screen size of between about 15 CM and about 25 CM, and may include a variety of other features such as front and/or rear camera(s), wire or cable connector(s) (e.g., proprietary, HDMI, USB, audio, charging/power, etc.), and wireless network connections (e.g., 3G/4G, Wi-Fi). Tablets may also currently have between about 500 MB and about 1 GB of RAM and between about 16 GB and about 64 GB of storage memory.

Tablets have many features that make them portable by nature. For example, tablets are battery powered and need only to be plugged in periodically to recharge the battery; the touch-screen display of tablets allows tablets to be operated without the use of a computer peripheral device like a mouse or keyboard; and, as noted above, the 3G/4G and WiFi network connections provide the tablet mobile internet connectivity. These features of tablets, in addition to their small form factor, allow for a high degree of portability. Consequently, a single tablet is often used in many different environments.

In most environments a user will operate a tablet while simply holding it in her hands. Some environments, however, may provide other opportunities to position a tablet. For example, a person using a tablet at a desk may place the tablet flat on the desk, prop the tablet up with books, or lean the tablet up against a wall. In addition, some tablet cases or covers are able to fold into a configuration that supports the tablet in a free-standing position.

SUMMARY

Embodiments for supporting tablets described herein generally provide devices and systems for releasably retaining and supporting tablets. According to one embodiment, a tablet mounting system can include a detachable tablet stand and a tablet mount. The detachable tablet stand can be configured to releasably retain a tablet and have a first surface configured to receive and support a back surface of the tablet. The tablet stand can be configured to rest on a horizontal surface such that a plane generally parallel with the first surface of the tablet stand forms an angle with the horizontal surface. The formed angle can be equal to or greater than 0 degrees and can be less than or equal to 90 degrees. The tablet mount can be configured to attach to a support member. The tablet mount can be configured to releasably retain the tablet stand and the tablet retained within the tablet stand.

In another embodiment, a detachable tablet stand can include a body portion, one or more tablet retaining portions and a stand portion. The body portion can have a first surface configured to receive and support a back surface of a tablet. The one or more tablet retaining portions can be attached to the body portion. The one or more tablet retaining portions can be configured to releasably retain a tablet against the body portion. The stand portion can be attached to the body portion. The stand portion can be configured to support the tablet stand on a horizontal surface such that a plane generally parallel with the first surface of the tablet stand forms an angle with the horizontal surface. The formed angle can be equal to or greater than 0 degrees and can be less than or equal to 90 degrees. The one or more tablet retaining portions and the stand portion can be configured with the body portion to be releasably retained in a tablet mount.

In another embodiment, a tablet mount for releasably retaining a tablet can include a support body, a first edge portion and a latching mechanism. The support body can define a recessed portion for receiving and storing a tablet stand attached to a tablet that is releasably retained by the tablet mount. The support body can be configured to receive a back surface of a retained tablet. The first edge portion can be coupled to and extending from the support body. The first edge portion can be configured to receive and support a first edge of a retained tablet. The latching mechanism can be coupled to the support body opposite from the first edge portion. The latching mechanism can be configured to engage a second edge of a retained tablet opposite the first edge so as to releasably retain a tablet within the tablet mount.

Some embodiments may optionally provide none, some, or all of the following advantages, features, and/or options, though, other advantages, features, and/or options not listed here may also be provided. The tablet stand can be configured to rest on a horizontal surface in at least two orientations such that a plane generally parallel with a first surface of the tablet stand forms an angle with the horizontal surface. Each angle can be equal to or greater than 0 degrees and less than or equal to 90 degrees. The tablet stand can be configured to releasably retain a tablet by compression against a length of the tablet. The tablet stand can be configured to releasably retain a tablet by compression against a thickness of the tablet. The tablet mount can include a docking station that has a connector configured to connect with a port on a tablet. In addition, the docking station can be configured to align the tablet such that the port in the tablet aligns with and connects to the connector as the tablet is positioned in the docking station.

In some cases the tablet mount can include an aperture that is located adjacent to a port in a retained tablet. The aperture can be configured to receive a tablet connector therethrough for connecting the tablet connector to the port in the retained tablet. The tablet mount can comprise a support body that defines a recessed portion for receiving and storing the tablet stand in a folded configuration. The support body can be configured to receive a back surface of the retained tablet. The tablet mount can comprise a first edge portion that is coupled to and extending from the support body. The first edge portion can be configured to receive and support a first edge of a retained tablet. The tablet mount further comprises a latching mechanism coupled to the support panel opposite the support body from the first edge portion, the latching mechanism configured to engage a second edge of the retained tablet opposite the first edge so as to releasably retain the tablet within the tablet mount.

In some cases the tablet mount can further include a second edge portion and a third edge portion that are coupled to and that extend from the support body. The second edge portion can be configured to engage a third edge of a retained tablet. The third edge portion can be configured to engage a fourth edge of the retained tablet. Such that the first edge portion, the second edge portion, the third edge portion, and the latching mechanism releasably retain the tablet within the tablet mount during rotation of the tablet mount between a portrait orientation and a landscape orientation. The tablet mount can include at least one ejection member that extends from the first edge portion of the tablet mount. The ejection member can be configured to engage with the first edge of a retained tablet. The ejection member can be biased to urge the first edge of the retained tablet away from the first edge portion of the tablet mount.

In some cases the tablet mounting system can include a base and a support member. The base can be configured to engage with a surface. The support member can be coupled to the base, such that the tablet mount can be attached to the support member to position the tablet mount and the retained tablet relative to the surface.

In some cases the body portion, the one or more tablet retaining portions, and the stand portion can be integrally formed. The tablet stand can be configured to rest on a horizontal surface in an orientation with sufficient stability so as to permit a user to interact with the tablet. The locking latch can comprise a biasing spring and a release mechanism.

In another embodiment, a method for mounting a tablet is described. The method can include providing a tablet and attaching a tablet stand to the tablet. The tablet stand can comprise a body portion and one or more tablet retaining portions that are attached to the body portion. The tablet retaining portions can be configured to releasably retain the tablet against the body portion of the tablet stand. The method can also include positioning the tablet and tablet stand within a tablet mount that is attached to a stand system. The tablet mount can comprise a support body that defines a recessed portion for receiving and storing the tablet stand and a first edge portion that can be coupled to and extend from the support body. The first edge portion can be configured to receive and support a first edge of the retained tablet.

The method can also include releasably retaining the tablet and the tablet stand after positioning the tablet and the tablet stand within the tablet mount. The method can also include engaging a latching mechanism to engage a second edge of a retained tablet opposite the first edge of the retained tablet. The latching mechanism can be supported by the support body opposite from the first edge portion of the tablet mount. The method can also include removing the tablet and the tablet stand from the tablet mount, moving a stand portion of the tablet stand into a support position, and positioning the tablet stand with the stand portion in the support position on a horizontal surface. A plane generally parallel to a surface of the tablet stand can then form an angle with the horizontal surface being equal to or greater than 0 degrees and less than or equal to 90 degrees.

These and various other features and advantages will be apparent from a reading of the following detailed description.

BRIEF DESCRIPTION OF THE DRAWINGS

The following drawings are illustrative of particular embodiments of the invention and therefore do not limit the scope of the invention. The drawings are not necessarily to scale (unless so stated) and are intended for use in conjunction with the explanations in the following detailed description. Embodiments of the invention will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Embodiments described herein provide systems, devices, and methods for releasably mounting, supporting and/or retaining tablet computing devices. As discussed above, tablet computing devices are well known and are also referred to herein as tablets. In general, a tablet is a mobile computer, typically integrated into a flat touch screen and primarily operated by touching the screen. This can often include the use of an onscreen virtual keyboard, rather than a physical keyboard. The form factor of a tablet offers a more mobile way to interact with a computer.

Although a tablet can be a very mobile computing device, in some situations a user may prefer to mount a tablet in a stationary position or may wish to mount a tablet in a single location while still providing a degree of position adjustability. For example, a user may determine that a mounted tablet can in some cases be easier to view and/or operate.

According to some embodiments that will be described hereinafter, aspects of some disclosed tablet mounting designs include a tablet mounting system for mounting a tablet. The tablet mounting system can include one or more of a tablet stand that is configured to releasably retain a tablet, a tablet mount that is configured to releasably retain the tablet stand and tablet, and one or more various structural components configured to mount other elements of the tablet mounting system to a support surface or support object, such as a desk or wall.

Figure 1A:
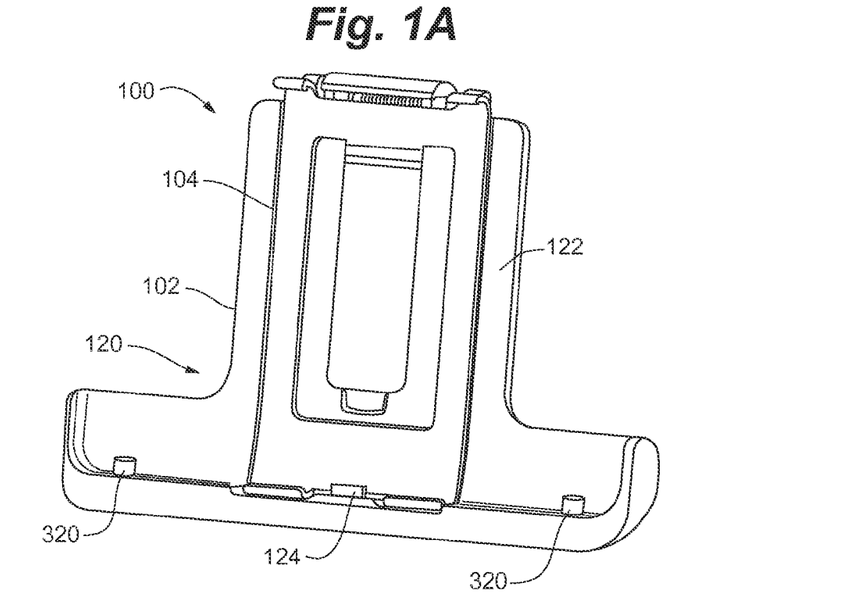
FIG. 1A is a front perspective view of a tablet mounting system in accordance with an embodiment.
Figure 1B:
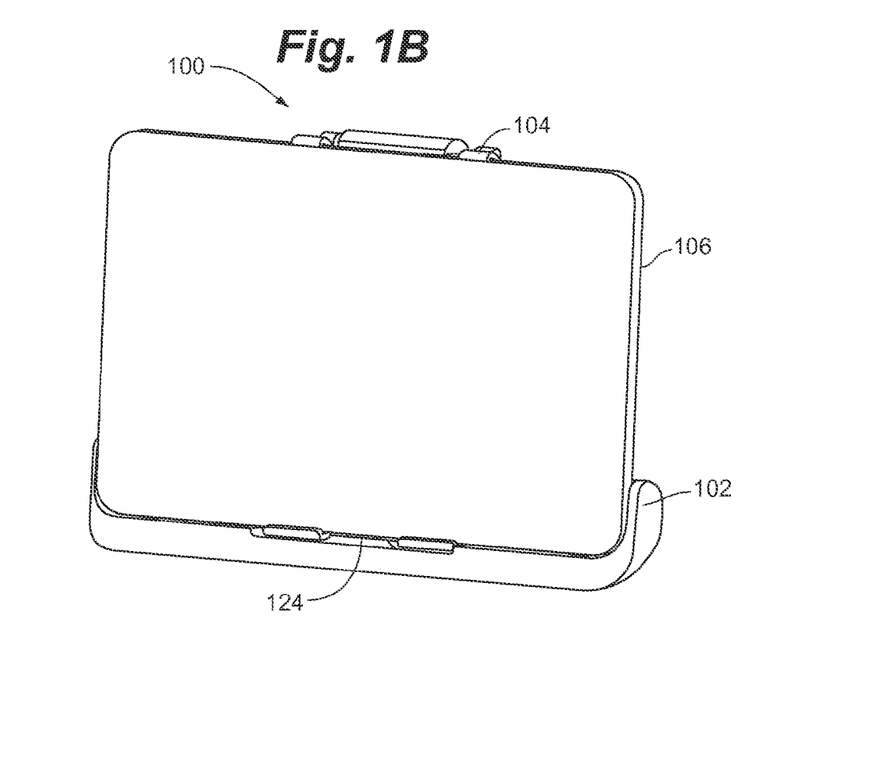
FIG. 1B is a front perspective view of the tablet mounting system of FIG. 1A with a retained tablet.
Figure 2:
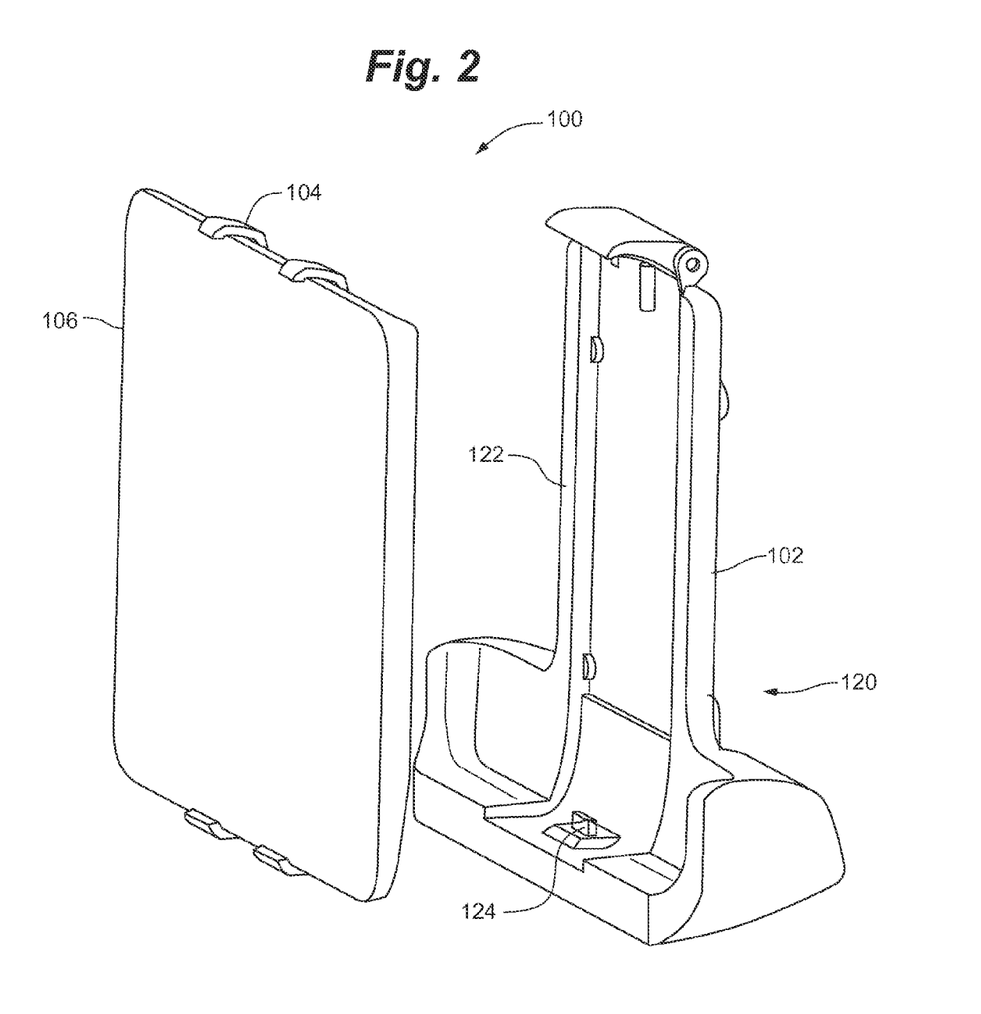
FIG. 2 is a front perspective assembly view of the tablet mounting system of FIGS. 1A-1B with a retained tablet.

FIGS. 1A-1B and FIG. 2 illustrate various views of a tablet mounting system 100 according to some embodiments. FIG. 1A is a front perspective view of the tablet mounting system 100. In general, the tablet mounting system 100 in this example includes a tablet mount 102 that is configured to releasably retain a detachable tablet stand 104. As shown in FIG. 1B, the tablet stand 104 is configured to releasably retain a tablet 106. Turning briefly to FIG. 2, a front perspective assembly view of the tablet mounting system 100 illustrates how the tablet stand 104 can be removed from the tablet mount 102 while still retaining the tablet 106. According to some embodiments, the tablet stand 104 is configured to rest on a horizontal surface, such as a table or desk, when it is removed from the tablet mount 102. Accordingly, the tablet stand 104 provides a further manner of positioning the tablet 106 in addition to mounting the tablet 106 within the tablet mount 102.

Figure 1C:
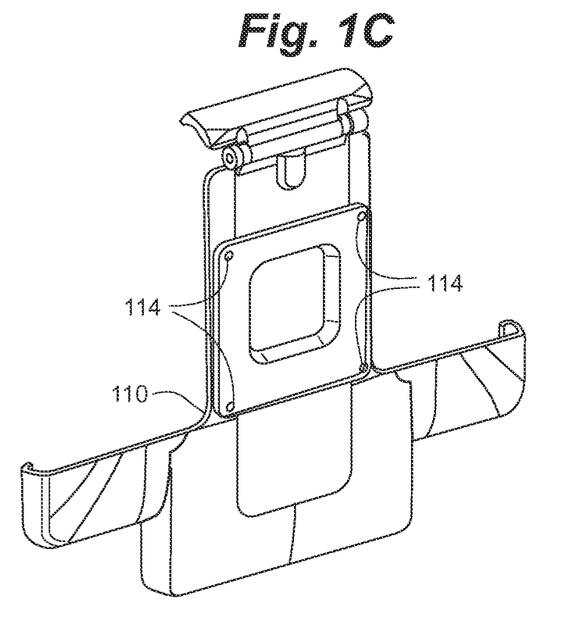
FIGS. 1C and 1D are rear perspective views of tablet mounts in accordance with some embodiments.
Figure 1D:
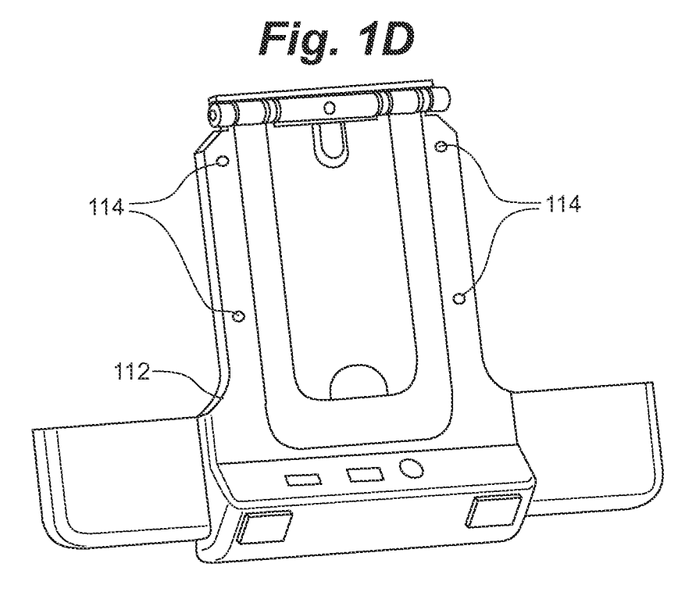

According to some embodiments, the tablet mount 102 may be configured to attach to a support member to provide additional positioning flexibility. For example, in some cases a tablet mounting system may also include one or more of a support member such as a riser, an articulating arm, a support column, etc., that can be attached to the tablet mount 102. In some cases a base may be provided that can be coupled with the tablet mount 102 and/or a support member. For example, in some cases, a support member such as an articulating arm may be coupled to a base that is configured to attach or otherwise engage with a support surface such as a desk, a table, a wall, or some other suitable support object. FIGS. 1C-1D illustrate a rear surface of two different examples of a tablet mount 110, 112 that are configured to attach to a support member such as a desk stand column. In these examples, the tablet mounts 110, 112 are configured with four mounting holes 114 that can be used to attach a support member. Any suitable mechanism or arrangement known in the art can be used to accomplish the coupling and it should be appreciated that a wide variety of alternatives are available. As just one example, in the illustrated embodiments, the mounting holes 114 are positioned in a VESA (Video Electronics Standards Association) compliant arrangement. The four mounting holes 114 are provided so that the tablet mounts 110, 112 can be attached to various types of supporting and/or positioning structure that also include VESA compliant mounting arrangements.

As a result, tablets mounted according to embodiments described herein can be releasably retained within a tablet stand and/or tablet mount, and the tablet mount can be coupled to a desk stand, a desk clamp arm, a notebook stand, a wall mount, a work cart, and/or a sit-stand workstation, to list just a few possibilities. Desk clamp arms useful for positioning a tablet mount include the support arms disclosed in U.S. Pat. No. 7,252,277, assigned to Ergotron, Inc., the contents of which are hereby incorporated by reference. In some embodiments, a vertical riser section can allow for height adjustability of a tablet mount and retained tablet relative to a base. Height adjustability can be provided, for example, by the height adjustment mechanisms described in US Patent Application Publication No. 2010/0176254, assigned to Ergotron, Inc., the contents of which are hereby incorporated by reference. Tablet mounts may also be attached to various types of notebook stands, examples of which are described in US Patent Publication No. 2007/259,554, titled Stand System and Method, assigned to Ergotron, Inc., the contents of which are hereby incorporated by reference. Further, a wall mount may be used to mount a tablet mount, tablet stand, and retained tablet upon a wall or other vertical surface. Examples of wall mounts potentially useful in this arrangement include the lift systems disclosed in U.S. Pat. No. 6,189,849, assigned to Ergotron, Inc., the contents of which are hereby incorporated by reference. Sit-stand workstations may also include one or more attached tablet mounts; examples of such workstations are described in U.S. patent application Ser. No. 13/191,170, filed Jul. 26, 2011, and titled Display Positioning Apparatus and Method, assigned to Ergotron, Inc., the contents of which are hereby incorporated by reference.

A mounted tablet can thus be used as an extension or an auxiliary display, and in this manner be used in combination with at least one other display device, to create a multiple display system including a tablet mounting system such as the system 100 shown in FIGS. 1A-1B and 2. As used herein, the term "tablet mounting system" is used to refer to various combinations of positioning components. For example, as discussed above with respect to FIGS. 1A-1B and 2, the tablet mounting system 100 is shown as simply including a tablet mount 102 and a tablet stand 104 that are configured to releasably retain the tablet 106. However, the scope of a tablet mounting system is not limited to these components, and may also include a cooperating desk stand, wall-mounted arm, and the like. Examples of additional embodiments including different types of supporting structural components will also be discussed below with reference to FIGS. 9A and 9B.

According to some embodiments, a tablet mount may also be a tablet docking station. As used herein, a tablet "docking station" refers to a type of a tablet mount that is configured to support a tablet, but that also provides connectivity options for the tablet. For example, in some cases a docking station can additionally provide a connector for connecting the docking station to a port on the tablet. The docking station can be configured to align a tablet, as the tablet is positioned into the docking station, such that a port in the tablet aligns with, and connects to, a corresponding connector in the docking station.

Referring back to FIGS. 1A and 2, in the embodiment illustrated in the figures, the tablet mount 102 is also configured as a tablet docking station 120. FIG. 1A shows the tablet docking station 120 in a front elevation view and the docking station 120 is shown with a retained tablet 106 in FIG. 1B. As will be discussed in more detail hereinafter, the tablet docking station 120 (i.e., the tablet mount 102) has a body portion 122 and a connector 124 which can be useful for electrically connecting to a port on the retained tablet 106. Examples of such connections can include, for example, connections to an external monitor, external input devices, such as a keyboard and/or a mouse, a power supply, a network, and/or to a separate computer, or another computing device when the docked tablet is to be used as an auxiliary display, as described above. The body portion 122 can be configured to align the tablet 106, as the tablet 106 is positioned in the docking station 120, such that the port in the tablet aligns with, and connects to, the connector 124.

Tablet ports are characteristically located along an edge of the tablet. Consequently, a port on a tablet can be located on the long edge, or the short edge of a tablet's typical rectangular form factor. Thus, depending on the particular brand of tablet that is used, a port can be located along the bottom edge of the tablet when the tablet is in a profile orientation, or a port can be located along the bottom edge of the tablet when the tablet is in a landscape orientation. In the illustrated example, the docking station connector 124 is located and configured to connect with a port on tablet 106 with the tablet positioned in a landscape orientation as shown in FIGS. 1B and 2.

While many or all of the examples of tablet mounts described herein with respect to the figures may also be tablet docking stations, it should be appreciated that a docking station may not be required or even desired in all situations, and thus embodiments may include tablet mounts without connectors that simply receive and releasably retain a tablet. Accordingly, examples that discuss a tablet being "docked" in a "tablet docking station" should also be understood to apply to tablets that are mounted in a tablet mount or tablet mounting system without a docking station connector, unless otherwise specified. Similarly, discussions of tablet mounts and tablet mounting systems are intended to encompass embodiments in which the tablet mount is a tablet docking station, unless otherwise specified. Some examples of other tablet mounts, including tablet docking stations, which could possibly be modified to be used with tablet mounting systems disclosed herein, can be found in U.S. patent application Ser. No. 13/650,702, and entitled Tablet Mounting Arm Systems And Methods, and U.S. patent application Ser. No. 13/650,631, and entitled Tablet Mounting Systems and Methods, both applications which are filed concurrently herewith on Oct. 12, 2012, and the contents of each of which are hereby incorporated by reference.

As will be appreciated, the ability to separately mount a tablet within a tablet stand and a tablet mount as shown in FIGS. 1A-2 can provide multiple advantages. As just one example, such a configuration can enable tablet 106 to be mounted or supported in two or more configurations or orientations. A docked tablet can be an auxiliary display for example, located above, below, or to either side of a primary display. Such multiple display systems can include a separate computer, or other computing device, connected to at least one other display device. In some multiple display embodiments, the tablet can act as the driver for images displayed on the tablet's screen as well as on one or more other display device(s). A tablet can also be docked and mounted in an orientation such that the tablet's touch screen can be used to operate the tablet. A tablet can also be docked and mounted such that it can be operated via an external keyboard, external mouse, and/or the tablet's touch screen.

At the same time, because a tablet can be a very mobile computing device, in some situations a user may desire to undock a mounted tablet and use it in a different location. In some cases, a user may wish to use such an undocked tablet in a mobile computing manner. In some instances, a user may wish to rest a tablet that has been undocked on a horizontal surface, such as a desk, in order to view and/or interact with the tablet in a different position and/or a different location than when the tablet was docked. In some situations, a user may opt to hold an undocked tablet, in some situations, a user may also desire to set an undocked tablet down in order to view and/or use the tablet. This can be on a horizontal surface, such as a desk, counter, or mobile cart. For many users, viewing and/or interacting with a tablet that has been placed flat on a horizontal surface may not provide an ergonomically advantageous viewing and/or interacting angle. For some users, it may be helpful to have a tablet stand that supports an undocked tablet, when it is set down on a horizontal surface, at a more convenient angle.

Additionally, a user may wish to re-dock (i.e., re-mount) an undocked (i.e., unmounted) tablet, for continued and/or additional use in a docked and mounted position. Depending on the environment in which the tablet is used, and/or user preference, alternating between docked and undocked use can continue with regularity during a given period of tablet use. Some embodiments thus provide for: (i) a tablet to be used in a docked or mounted position, (ii) for the tablet to be easily and quickly undocked/unmounted, and (iii) for a tablet to be supported by a tablet stand when placed on a horizontal surface.

Figure 3:
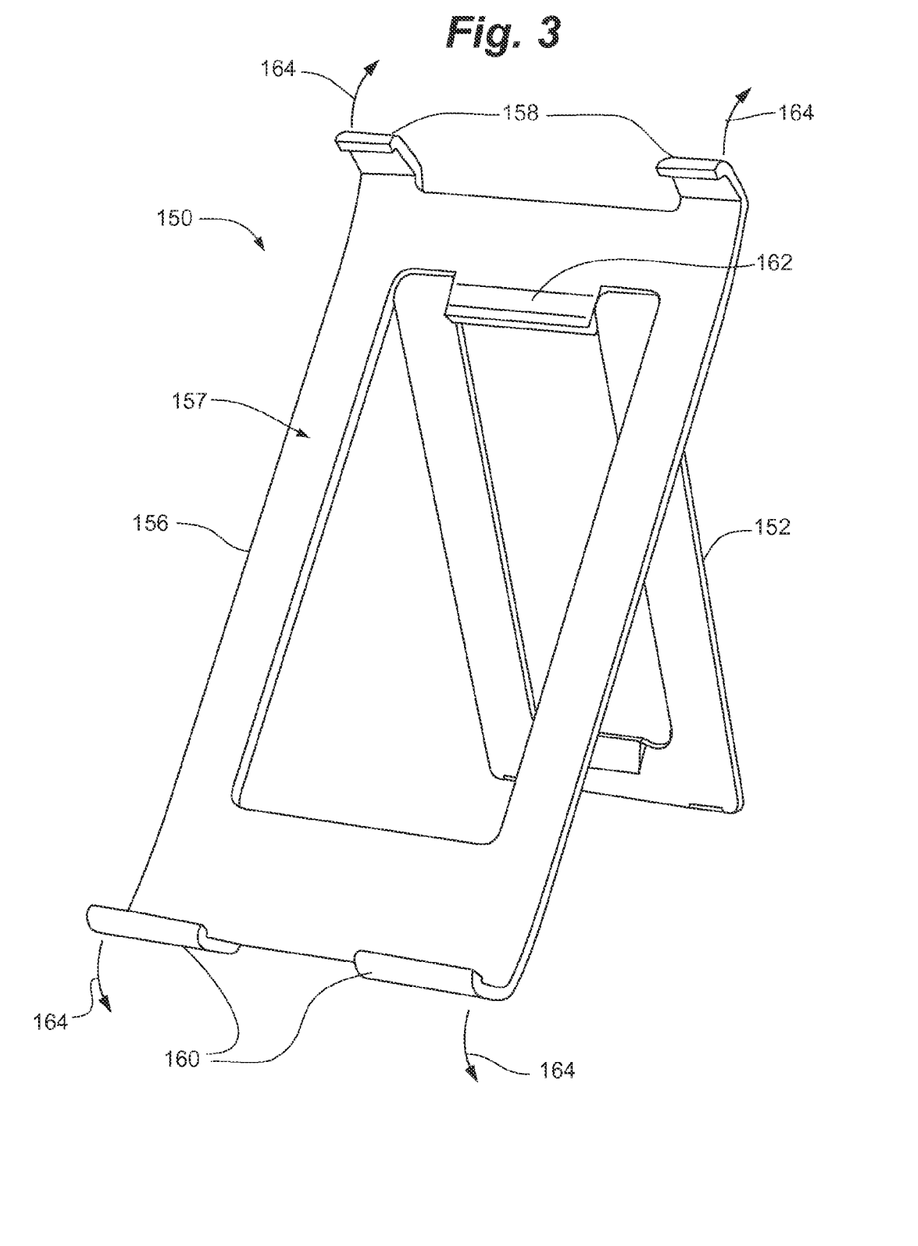
FIG. 3 is a front perspective view of a detachable tablet stand in accordance with an embodiment.

Turning now to FIGS. 3-6B, examples of various tablet stands will be described according to some embodiments. FIG. 3 is a front perspective view of a detachable tablet stand 150 according to some embodiments. As will be appreciated, the tablet stand 150 has similarities to and provides similar functionality to the stand 104 illustrated as part of the tablet mounting system 100 in FIGS. 1A-1B and 2. FIG. 4A is a rear perspective view of the detachable tablet stand 150, in this case with a tablet 106 mounted within the stand 150 and a stand portion 152 folded in against the tablet stand 150. FIG. 4B is a rear perspective view of the detachable tablet stand 150 and tablet 106, with the stand portion 152 pivoted out so that the tablet 106 and stand 150 are supported in a free-standing orientation a horizontal surface 154 in accordance with some embodiments.

Figure 4A:
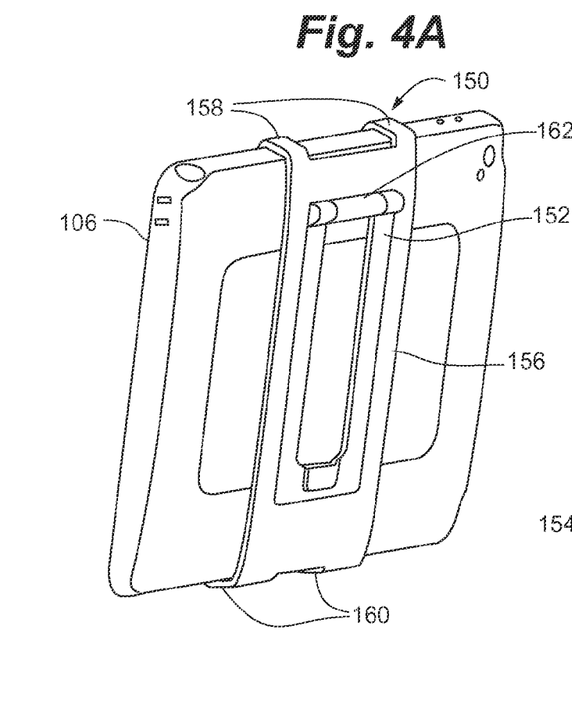
FIG. 4A is a rear perspective view of the detachable tablet stand of FIG. 3 with a retained tablet.
Figure 4B:
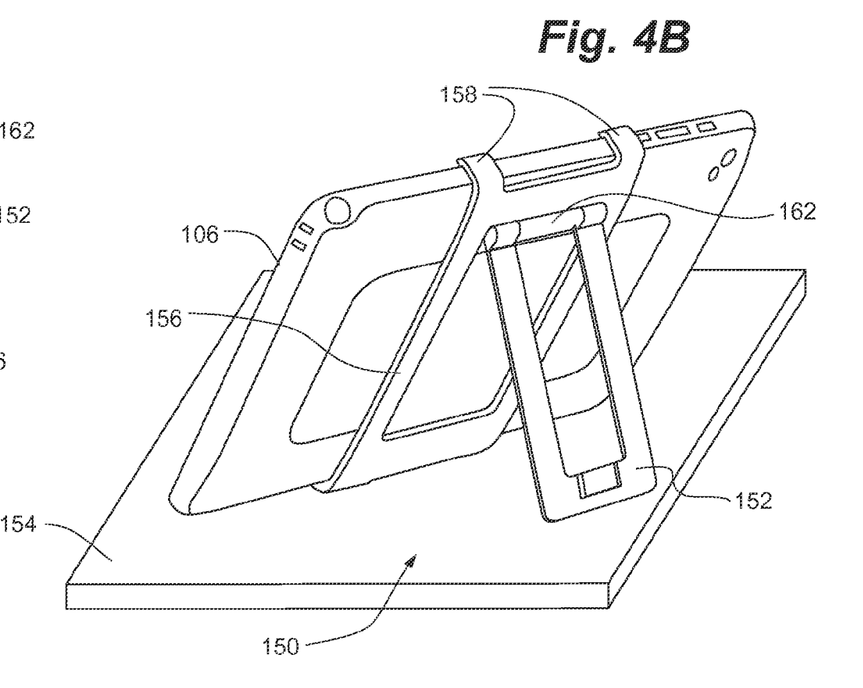
FIG. 4B is a rear perspective view of the detachable tablet stand of FIG. 3 with a retained tablet, supported by a horizontal surface in accordance with an embodiment.

Referring to FIGS. 3, 4A, and 4B the tablet stand 150 includes a body portion 156, one or more tablet retaining portions 158, 160, and the stand portion 152. The body portion 156 generally defines at least a first surface 157 that is configured to receive a tablet and also provide an indication of the angle of inclination between a plane generally parallel to the first surface 157 and a horizontal surface, as will be discussed hereinafter. As depicted, the stand portion 152 is attached to the body portion by a hinge 162, and the stand portion 152 can be moved from a closed position, as depicted in FIG. 4A to an open position, as depicted in FIG. 4B. The tablet retaining portions 158, 160 can have any shape that is useful for releasably retaining the tablet 106. Each of the one or more tablet retaining portions of a tablet stand need not be the same size or shape as other tablet retaining portions included on the same stand. For example, as depicted in FIG. 3, tablet stand 150 has two tablet retaining portions 158 at the top of the tablet stand 150 and two tablet retaining portions 160 at the bottom of the stand. As can be seen from the figure, the two tablet retaining portions 158 at the top of the stand are narrower than the two tablet retaining portions 160 at the bottom of the stand.

In the embodiment depicted in FIG. 3, the four tablet retaining portions 158, 160 work cooperatively to releasably retain a tablet by deflecting outwards, in the directions indicated by the arrows 164, to receive a tablet, and then springing back to retain the tablet. Thus the tablet retaining portions 158, 160 are biased to retain a tablet by compression against either the length or width of a tablet (depending on if the stand is retaining a tablet in a landscape or portrait orientation, which is discussed in greater detail below). The tablet retaining portions 158, 160 can be made from any elastically deflectable material, which can include various plastics, metals or composite materials, which can include, for example, fiberglass or carbon fiber composites. Other tablet retaining portions are also contemplated, such as tablet retaining portions that releasably retain a tablet by compression against the thickness of a tablet. Such tablet retaining portions can include silicone or rubber lined retention portions as an additional component in the compression retention. A tablet stand can also include tablet retention portions that are integrally formed with the body portion, as depicted in FIGS. 3, 4A, 4B according to some embodiments.

Figure 6A:
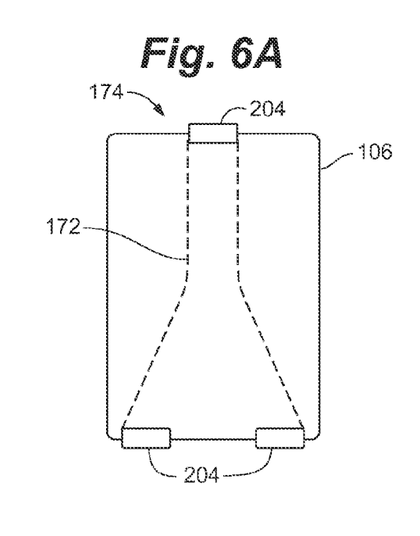
FIG. 6A is a front elevation view of a detachable tablet stand with a retained tablet in accordance with an embodiment.
Figure 6B:
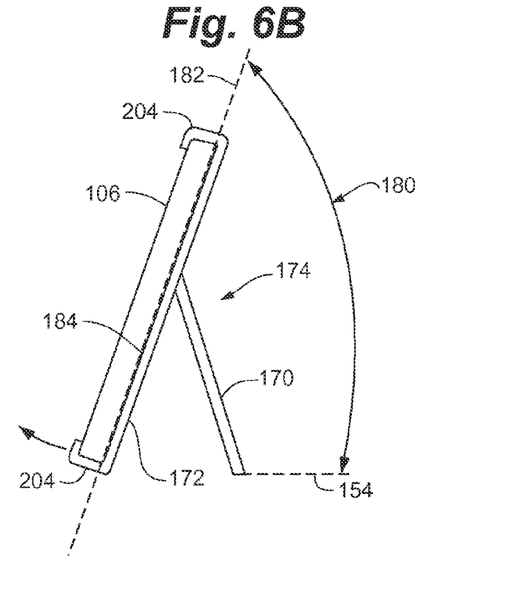
FIG. 6B is a side elevation view of the detachable tablet stand of FIG. 6A with the retained tablet.

According to some embodiments, such as in the embodiment depicted in FIGS. 3, 4A, and 4B, a stand portion 152 can be attached to the body portion by a hinge 162. In some embodiments, as depicted in FIGS. 6A-6B, a stand portion 170 can be integrally formed with a body portion 172 of the stand 174. In such embodiments, the stand portion is formed in the position depicted in FIG. 6B, and when the tablet stand 174 is retained in a docking station, the stand portion 170 is deflected towards the body portion 172 in a spring-like manner. When the tablet stand 174 is removed from the docking station, the stand portion 170 is permitted to relax and return to the position depicted in FIG. 6B.

Figure 5A:
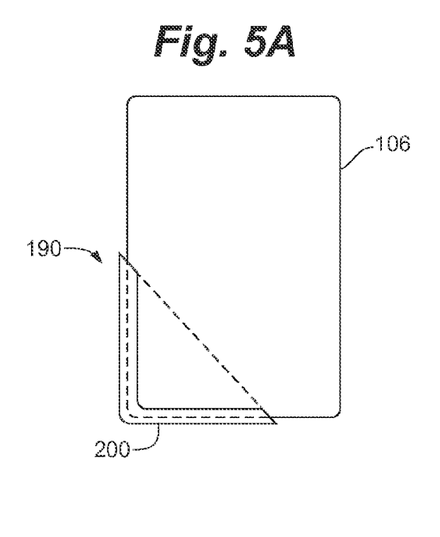
FIG. 5A is a front elevation view of a detachable tablet stand with a retained tablet in accordance with an embodiment.
Figure 5B:
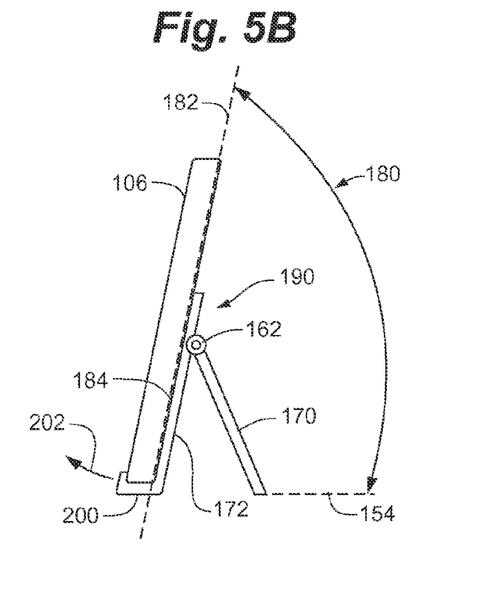
FIG. 5B is a side elevation view of the detachable tablet stand of FIG. 5A with the retained tablet.

When a tablet stand is resting on a horizontal surface 154, as depicted in FIG. 4B, an attached tablet 106 can be inclined with respect to the surface 154. In some cases, this incline can be expressed in terms of the angle that a screen of the retained tablet forms with the horizontal surface. Turning to FIGS. 5B and 6B, in some cases, the incline may also or alternatively be expressed in terms of the angle 180 that a plane 182, generally parallel with a first surface 184 of the body portion 172, forms with the horizontal surface 154. According to some embodiments, the angle 180 can be varied from 0 degrees (i.e., the tablet 106 and stand 174 are resting flat on the horizontal surface) to 90 degrees (i.e., the tablet and the first surface 184 of the stand 174 are perpendicular with the horizontal surface). As one skilled in the art can appreciate, the angle 180 can vary depending upon such things as, for example, the length and/or configuration of the stand portion 170, the angle that the stand portion 170 makes with the body portion 172 and the location where the stand portion joins the body portion (e.g., the hinge 162 for embodiments having a hinged stand portion like in FIGS. 4A-4B and 5A-5B).

According to some embodiments that use a hinge, the hinge can be equipped with pre-formed detents. For these embodiments, a user can vary the angle 180 by rotating the hinge (and thus the stand portion 170) from one detent to the next. As the stand portion is rotated away from the body portion, the angle that the stand portion makes with the body portion is increased and conversely, the angle 180 is decreased. Such a mechanism can permit a user to adjust an undocked tablet to a preferred angle for viewing and/or interacting with a tablet. Accordingly, in some cases a tablet stand can be configured with at least two orientations with respect to a horizontal surface, and potentially many more depending upon the number of detents included or other structural limitations affecting the formed angles.

In some cases, the body portion, the tablet retaining portion, and the stand portion of a tablet stand can be configured with a relatively low profile with respect to the thickness of a tablet. A relatively low profile can be advantageous, as a thin tablet stand can be more easily configured to be releasably retained in a docking station and can be more convenient for portable tablet use. On the other hand, a more rigid tablet stand, which can require a thicker stand profile, may provide a more stable platform for a user to interact with a tablet when it is undocked, and resting on a horizontal surface.

As discussed above with reference to FIGS. 3 and 4A-4B, tablet retaining portions can be provided in a variety of configurations in order to configure a tablet stand so that it will releasably retain a tablet using the tablet retaining portions. As shown in FIGS. 5A and 5B, in some embodiments, a tablet stand 190 includes a single angled tablet retaining portion 200 which can releasably retain a tablet 106 through the use of a compression or friction fit of the tablet's thickness. In this embodiment, retaining portion 200 can be forced to move in the direction of arrow 202 in order to accept a tablet, and then retaining portion 200 can spring back to the position as depicted in order to retain the tablet. Thus the retaining portion 200 of tablet stand 190 is not dimensioned according to either a tablet's height or width, but rather a tablet's thickness. Such a retaining portion 200 can therefore retain a tablet in either portrait or landscape orientations, which can provide additional user options for viewing and/or interacting with a tablet. Likewise, tablet stands that have retaining portions which include a spring clip, or similar structure can also provide both landscape and portrait tablet orientations when resting on a horizontal surface.

FIGS. 6A and 6B depict an elevation front view and an elevation side view of tablet stand 174, according to some embodiments. Tablet stand 174 features a generally up-side-down funnel shaped body portion 172 and three tablet retaining portions 204. Retaining portions 204 can be made from any elastically deflectable material, as discussed above, and work to accept and retain a tablet by compression against either the length or width of a tablet, in much the same manner as retaining portions 158, 160 depicted in FIGS. 3, 4A, and 4B. Advantageously, tablet stand 174 can rest with more stability on uneven horizontal surfaces because stand 174 has only three points of contact: the two lower tablet retaining portions 204, and the stand portion 170.

Figure 7:
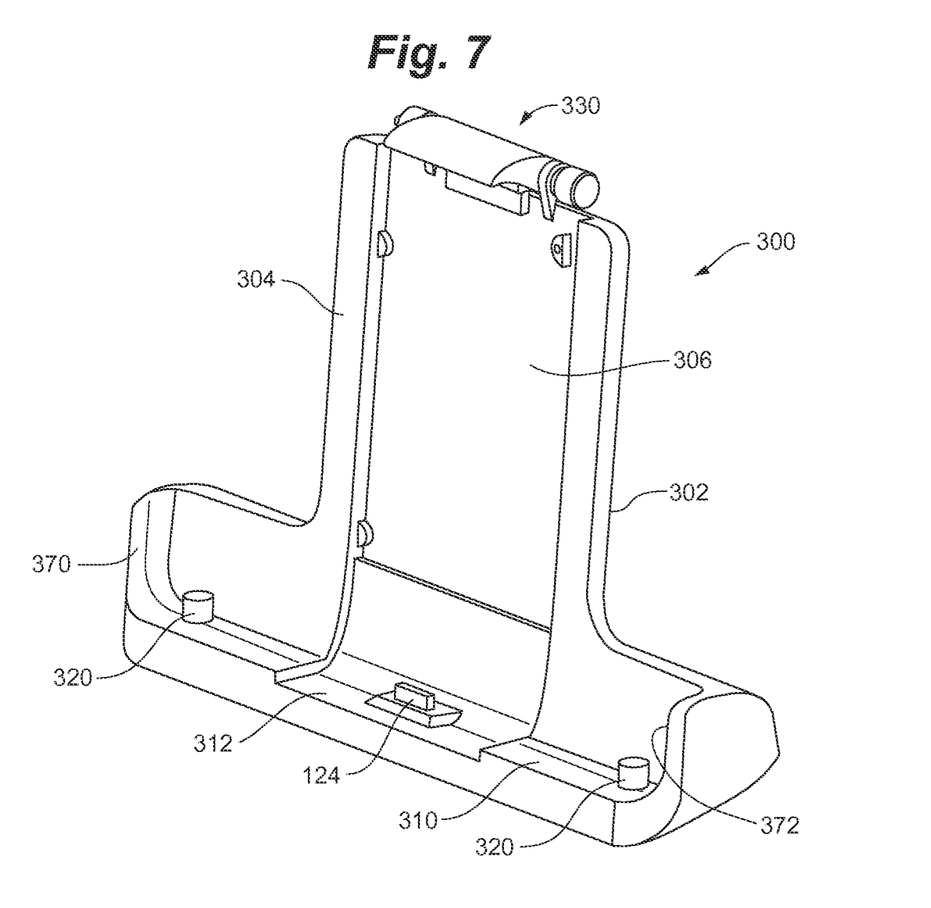
FIG. 7 is a front perspective view of a tablet docking station in accordance with an embodiment.

Turning now to FIG. 7, an embodiment depicting a tablet mount 300 in the form of a tablet docking station 302 will now be described. As previously discussed above, the tablet mount 300 is configured to attach to a support member proximate a back surface of the mount 300, which is not shown in FIG. 7. The tablet mount 300 is generally configured to releasably retain a tablet stand and a tablet as previously discussed. According to some embodiments, such as the embodiment illustrated in FIG. 7, a tablet mount is provided as a docking station, and thus includes a connector 124 that connects with a tablet port to provide connectivity, including for power and/or communication. Of course, in some cases a tablet mounting system may not include a docking station and may simply provide a tablet mount configured to releasably retain a tablet and a tablet stand. In some cases, instead of a fully operational docking station, it is contemplated that a tablet mount may be configured to provide cable access to one or more ports on a tablet within the tablet mount. For example, the tablet mount may define an aperture adjacent the tablet port that allows a cabled connector to plug into the port.

As shown in FIG. 7, the tablet mount/docking station 300, 302 includes a body portion 304 that includes a tablet stand retaining portion 306 in the form of a cut out or recessed area. Turning briefly to FIG. 1A, an example of a tablet stand 104 being inserted and retained in a tablet stand retaining portion is shown. As shown in FIG. 7, the tablet stand retaining portion 306 can be a recessed portion of the body 304 sized and shaped to receive a tablet stand, in many cases in a folded configuration as shown in FIG. 4A.

As can be further seen from FIG. 7, the bottom portion of the body portion 304 includes an edge portion or platform 310 which is coupled to and extends away from the body portion that defines the tablet stand retaining portion 306. In addition, the edge portion/platform 310 includes a recessed portion 312 of the platform in this embodiment. Platform 310 and the recessed portion 312 of the platform can work cooperatively with the tablet stand retaining portion 306 to retain a tablet stand. As a tablet stand can fit within the tablet stand retaining portion 306, including within the recessed portion 312 of the platform, the lower edge of a retained tablet can rest on platform 310. As a result, docking station 302 can accept tablets that are retained in a tablet stand, as depicted in FIG. 1B. This also permits the body portion 304 to align the tablet, as the tablet is positioned in the docking station 302, such that a port in the tablet aligns with, and connects to, the connector 124, as the tablet is inserted into the tablet mount.

According to some embodiments, a tablet mount or docking station may include means to assist in removing a tablet from the mount. For example, FIGS. 1A and 7 illustrate a tablet docking station having an ejector mechanism with two ejector tabs 320. Ejector tabs 320 extend up from the platform area 310 of the body portion and are biased (e.g., spring biased) to urge the corresponding edge of the tablet up and away from the body portion platform 310. Thus, the ejector tabs 320 can assist a user in releasing a retained tablet 106 along with a tablet stand, when the tablet 106 is retained in a tablet stand, and the tablet stand is retained in the docking station.

Figure 8:
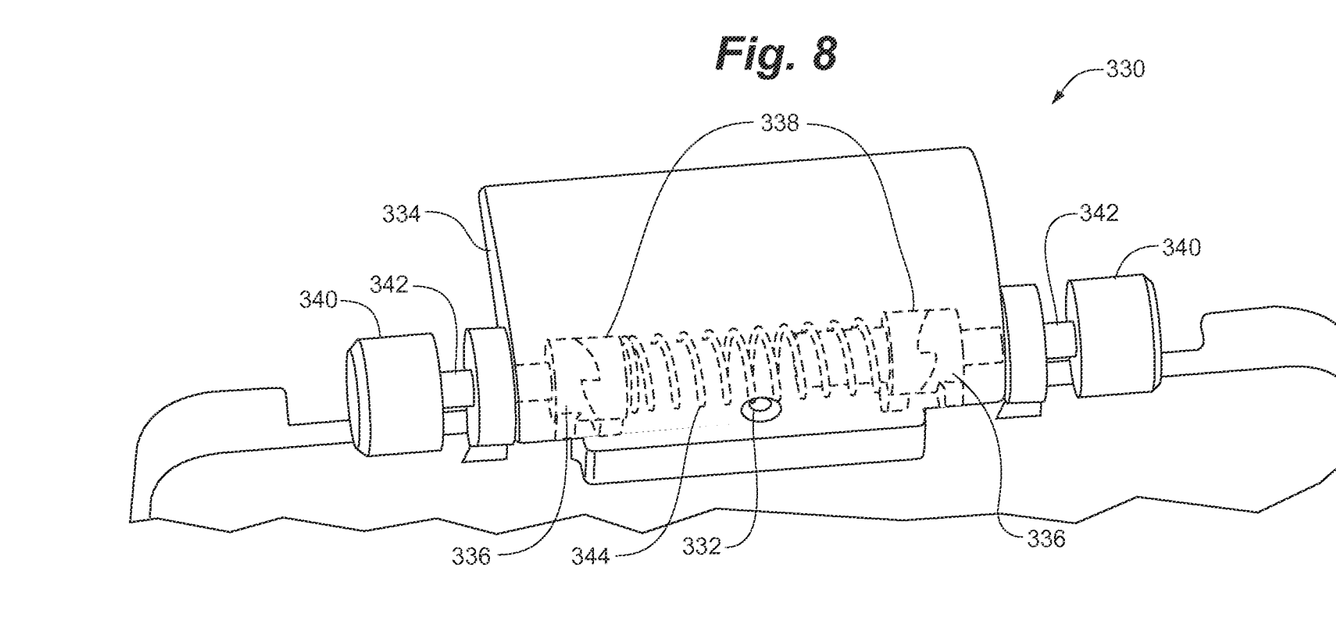
FIG. 8 is a partial rear perspective view of the tablet docking station of FIG. 7, showing a latching mechanism in accordance with an embodiment.

In some embodiments, a locking latch 330 can also be provided with a docking station as depicted in FIG. 7. In the embodiment shown in FIG. 7, the locking mechanism or latch 330 is coupled to the body portion 304 opposite from the lower edge portion coinciding with the platform 310. A locking latch can function cooperatively with a tablet retaining portion 306 to releasably retain a tablet and tablet stand within a docking station by engaging a second edge of the retained tablet opposite from the tablet edge that is supported and retained by the platform 310. As shown in FIG. 8, a spring 332 urges the latch 334 to engage with, and retain a tablet stand. Two pairs of locking teeth work to enable the latch to alternately engage with a tablet and stand, or to release the tablet and stand. A first set of locking teeth 336 are clocked to the latch 334. A second set of moving teeth 338 are connected to push buttons 340 via two connecting rods 342. A centrally located compression spring 344 is biased against the two moving teeth 338, forcing them to engage with the locking teeth 336, and when so engaged, the spring 344 can act on the latch 334 to "lock" the latch's engagement with a tablet stand. When a user pushes the two push buttons 340 inwardly, the moving teeth 338 are also moved inwardly due to their connection with the push buttons 340 via the two connecting rods 342. The moving teeth 338 move inwardly and compress the spring 344. This disengages the moving teeth 388 from the locking teeth 336 Once disengaged, the latch 334 is released from engaging with a retained tablet stand.

According to some embodiments, a tablet mount or docking station includes two, three or more edge portions as part of the tablet mount/docking station body portion. The additional edge or platform portions of the mount/station body can assist with releasably retaining a tablet as the mount or docking station rotates from a landscape to a portrait orientation or vice versa. For example, as shown in FIG. 7, the tablet mount 300 includes the body portion 304 that includes a first edge portion or platform 310 that is configured to receive a first edge of a tablet. In addition, the body portion includes a second edge portion 370 and a third edge portion 372 adjacent the first edge portion. The second and third edge portions 370, 372 are generally configured to engage the other sides or edges of a tablet that is retained within the mount. Thus, with all three edge portions or platforms 310, 370, and 372, as well as the latching mechanism 330 acting on a tablet, the tablet remains releasably retained within the mount, even though the mount might rotate through 360 degrees or more.

Figure 9A:
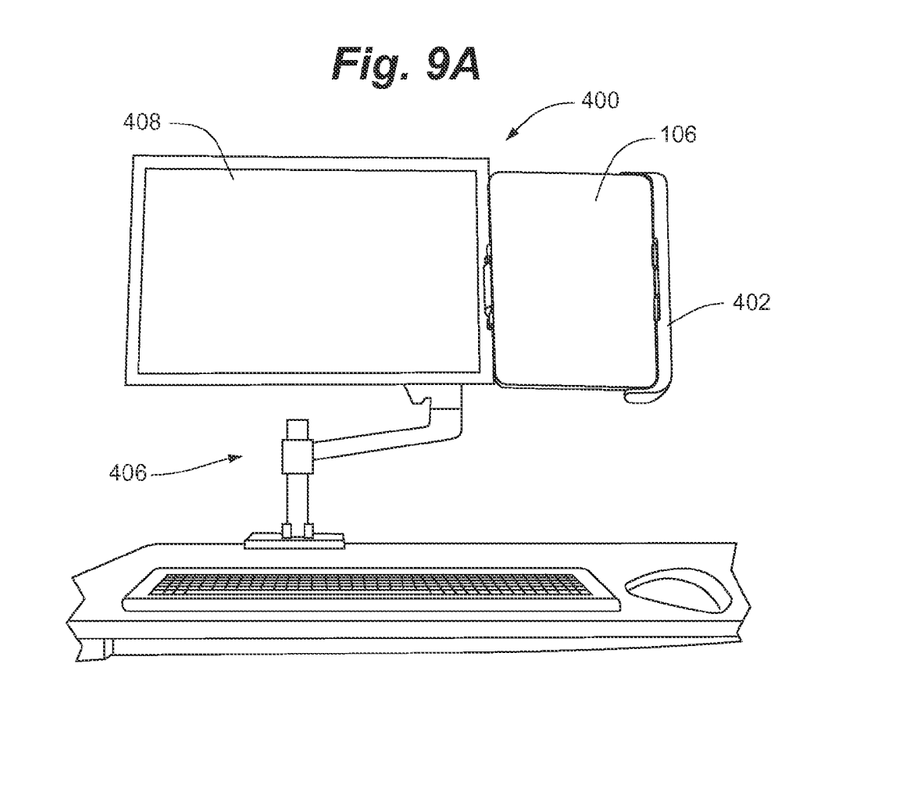
FIG. 9A is a front view of a tablet mounting system in accordance with an embodiment.
Figure 9B:
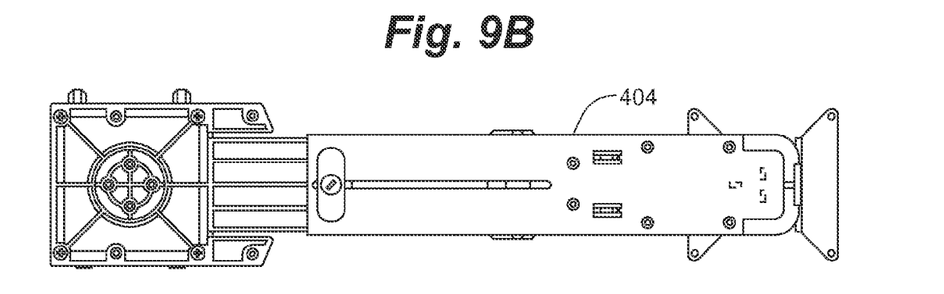
FIG. 9B is a front view of a tablet mounting system including a tablet support arm in accordance with an embodiment.

FIGS. 9A and 9B illustrate components of one possible embodiment of a tablet mounting system 400 according to some embodiments. As discussed above, tablets mounted according to embodiments described herein can be releasably retained within a tablet stand and/or tablet mount, and the tablet mount can be coupled to a desk stand, a desk clamp arm, a notebook stand, a wall mount, a work cart, and/or a sit-stand workstation, to list just a few possibilities. In this example, a tablet 106 is releasably retained within a tablet mount 402, which is similar to one or more of the mount/docking stations described above with respect to the other figures. Although not shown in FIG. 9A, the tablet mount 402 is attached to a tablet support arm 404 (FIG. 9B), which in turn is attached to a desk clamp 406. The desk clamp 406 and the support arm 404 also support a display monitor 408, thus providing a multi-display embodiment in which the tablet 106 may optionally generate the video signal for the display monitor.

In addition to tablet mounting systems, tablet mounts, tablet docking stations and other embodiments described elsewhere herein, some embodiments provide methods for mounting a tablet. As just one example, a method for mounting a tablet can include providing the tablet, attaching a tablet stand (such as one of those described herein) to the tablet, and then positioning the tablet stand and the tablet within a tablet mount or docking station as described above. Further steps in some methods can include releasably retaining the tablet and the tablet stand within the tablet mount after positioning them there. For example, in some cases the tablet and tablet mount can be releasably retained by sliding the tablet into engagement with edge portions or platforms of a tablet mount body portion and then engaging a latching mechanism as described above with respect to FIGS. 7 and 8. Another embodiment involves removing the tablet and the tablet stand from the tablet mount and moving a stand portion of the tablet stand into a support position to thereby position the tablet stand with the stand portion in the support position on a horizontal surface. Accordingly, in position, a plane generally parallel with a first surface of the body portion of the tablet mount forms an angle with the horizontal surface that is greater than or equal to 0 degrees and less than or equal to 90 degrees.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A tablet mounting system comprising:
  a detachable tablet stand configured to rest on a horizontal surface and releasably retain a tablet, the tablet stand having:
    a body portion having a first surface configured to receive and support a back surface of a tablet,
    a stand portion configured to attach to the body portion, the stand portion having an open position in which the stand portion is pivoted away from the body portion to support the tablet in an inclined position, and a closed position in which the stand portion is pivoted toward the body portion to support the tablet in a generally horizontal position; and
  a tablet mount configured to releasably retain the tablet stand and the tablet retained within the tablet stand within at least a portion of a perimeter of the tablet mount, the tablet mount further configured to rest on the horizontal surface while supporting the retained tablet stand and tablet, the tablet mount including a docking station having a connector configured to connect with a port on the tablet.

2. The tablet mounting system of claim 1, wherein the tablet stand is configured to releasably retain the tablet by compression against a length of the tablet.

3. The tablet mounting system of claim 1, wherein the tablet stand is configured to releasably retain the tablet by compression against a thickness of the tablet.

4. The tablet mounting system of claim 1, wherein the docking station is configured to align the tablet such that the port in the tablet aligns with and connects to the connector as the tablet is positioned in the docking station.

5. The tablet mounting system of claim 1, wherein the tablet mount comprises a support body and a first edge portion coupled to and extending from the support body, the first edge portion configured to receive and support a first edge of the retained tablet.

6. The tablet mounting system of claim 5, wherein the tablet mount further comprises a latching mechanism coupled to the support body opposite from the first edge portion, the latching mechanism configured to engage a second edge of the retained tablet opposite the first edge so as to releasably retain the tablet within the tablet mount.

7. The tablet mounting system of claim 6, wherein the tablet mount further comprises a second edge portion and a third edge portion coupled to and extending from the support body, the second edge portion configured to engage a third edge of the retained tablet and the third edge portion configured to engage a fourth edge of the retained tablet, whereby the first edge portion, the second edge portion, the third edge portion, and the latching mechanism releasably retain the tablet within the tablet mount during rotation of the tablet mount between a portrait orientation and a landscape orientation.

8. The tablet mounting system of claim 6, wherein the tablet mount comprises at least one ejection member extending from the first edge portion of the tablet mount, the ejection member configured to engage the first edge of the retained tablet and biased to urge the first edge of the retained tablet away from the first edge portion of the tablet mount.

9. The tablet mounting system of claim 1, further comprising a base configured to engage with a surface, a support member coupled to the base, and wherein the tablet mount is attached to the support member to position the tablet mount and the retained tablet relative to the surface.

10. A tablet mounting system comprising:
a detachable tablet stand having a first surface configured to receive and support a back surface of a tablet, the tablet stand configured to releasably retain the tablet, the tablet stand further configured to rest on a horizontal surface such that a plane generally parallel with the first surface of the tablet stand forms an angle with the horizontal surface, the formed angle being equal to or greater than 0 degrees and less than or equal to 90 degrees; and
a tablet mount configured to releasably retain the tablet stand and the tablet retained within the tablet stand, the tablet mount including:
a support body defining a recessed portion for receiving and storing the tablet stand in a folded configuration;
a first edge portion coupled to and extending from the support body, the first edge portion configured to receive and support a first edge of the retained tablet;
a latching mechanism coupled to the support body opposite from the first edge portion, the latching mechanism configured to engage a second edge of the retained tablet opposite the first edge so as to releasably retain the tablet within the tablet mount; and
at least one ejection member extending from the first edge portion of the tablet mount, the ejection member configured to engage the first edge of the retained tablet and biased to urge the first edge of the retained tablet away from the first edge portion of the tablet mount.

11. The tablet mounting system of claim 1 wherein the stand portion includes a hinge, and the stand portion is configured to attach to the body portion using the hinge.

* * * * *